(12) United States Patent
Lei et al.

(10) Patent No.: US 6,946,890 B1
(45) Date of Patent: Sep. 20, 2005

(54) LOW NOISE LEVEL SHIFTING CIRCUITS AND METHODS AND SYSTEMS USING THE SAME

(75) Inventors: Tom Gong Lei, Austin, TX (US); Timothy Thomas Rueger, Austin, TX (US); Stephen Timothy Hodapp, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 9 days.

(21) Appl. No.: 10/798,661

(22) Filed: Mar. 11, 2004

(51) Int. Cl.[7] ............................................. H03L 5/00
(52) U.S. Cl. ...................................... 327/310; 327/333
(58) Field of Search ................................ 327/310, 316, 327/318, 319, 322, 333; 330/279; 341/144, 341/162; 360/75

(56) References Cited

U.S. PATENT DOCUMENTS

| | | | |
|---|---|---|---|
| 4,065,726 A | * | 12/1977 | Senger ........................ 330/288 |
| 2003/0099346 A1 | * | 5/2003 | Joffe et al. .............. 379/387.01 |

* cited by examiner

*Primary Examiner*—Linh My Nguyen
(74) *Attorney, Agent, or Firm*—James J. Murphy; Thompson & Knight LLP

(57) ABSTRACT

A driver circuit includes an operational amplifier having an input and an output coupled by a feedback element. A voltage level shifter generates a voltage drop from the operational amplifier output to the operational amplifier input with a current source transistor setting a current controlling the voltage drop across the feedback element. A chopper circuit shifts flicker noise generated by the current source transistor to a higher frequency spectrum.

20 Claims, 4 Drawing Sheets

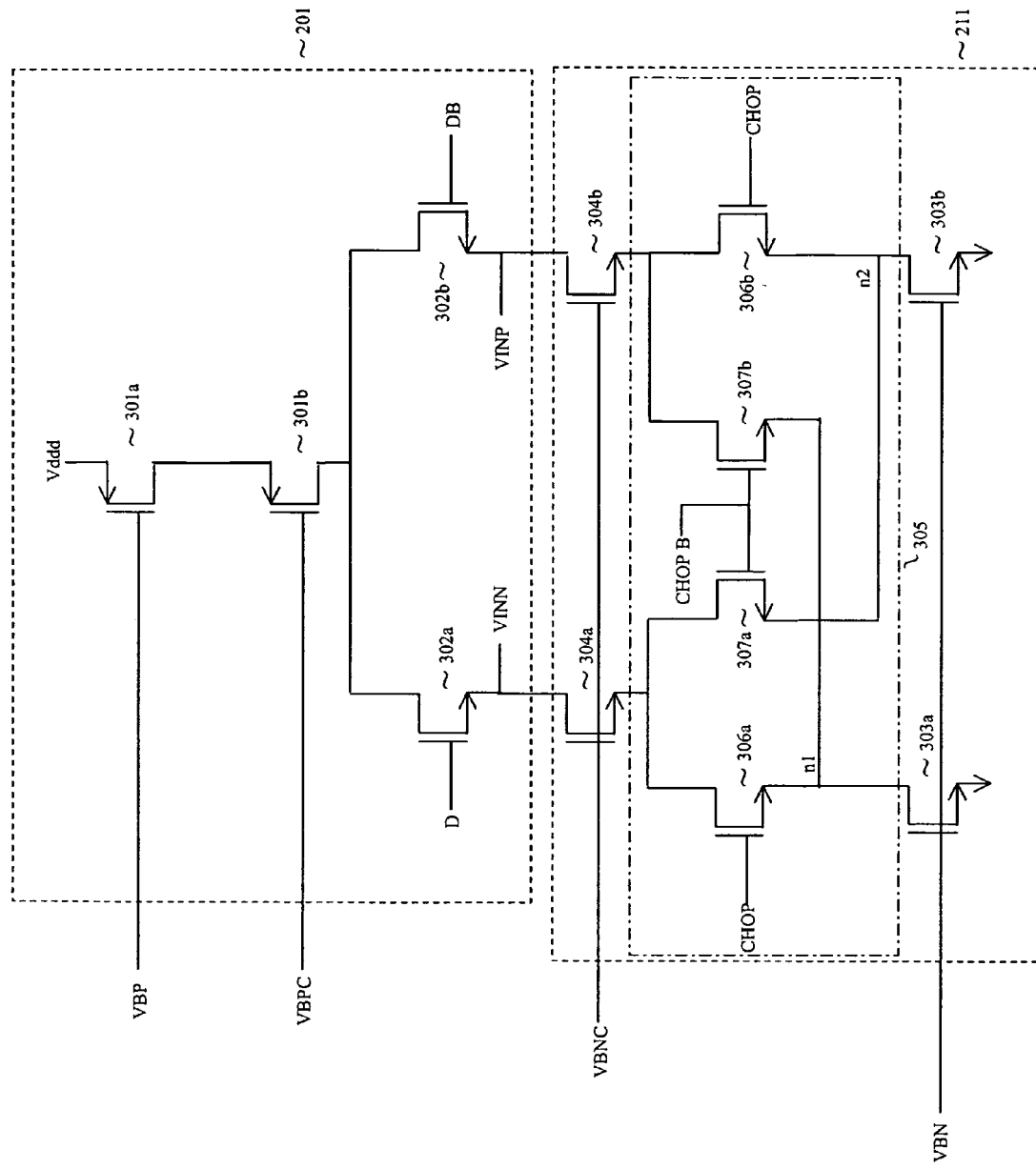

LOW NOISE LEVEL SHIFTING CIRCUITS AND METHODS AND SYSTEMS USING THE SAME

FIELD OF INVENTION

The present invention relates in general to mixed-signal integrated circuits and, in particular, with low noise level shifting circuits and methods and systems using the same.

BACKGROUND OF THE INVENTION

In the design of the mixed-signal integrated circuits, minimization of chip surface area and noise optimization are typically two critical goals. One technique, which generally addresses both problems, is the utilization of low voltage transistors, operating from a low voltage supply rail, in at least some parts of the circuitry. Low voltage field effect transistors have shorter channel lengths and thus consume less chip surface area. Low voltage transistors also normally generate less noise and the associated lower gate voltage swing typically results in reduced total harmonic distortion in the output signal.

The utilization of low voltage transistors in conjunction with other on-chip devices and circuits operating at higher voltages dictates the use of intervening voltage level shifters. Level shifting circuitry, however, can further increase the overall level of noise in the system. Therefore, level shifting circuits and methods are required which provide the required level of voltage shifting, yet introduce a minimal level of additional system noise.

SUMMARY OF INVENTION

A driver circuit includes an operational amplifier having an input and an output coupled by a feedback element. A voltage level shifter generates a voltage drop from the operational amplifier output to the operational amplifier input with a current source transistor setting a current controlling the voltage drop across the feedback element. A chopper shifts flicker noise generated by the current source transistor to a higher frequency spectrum.

Advantageously, the flicker noise of level shifters embodying the principles of the present invention is chopped and thereby shifted to higher out of signal band frequencies. In turn, a wide range of circuits, operating from high and low power supplies, may be constructed in which low voltage transistors are utilized to reduce chip area and/or improve noise performance.

BRIEF DESCRIPTION OF DRAWINGS

For a more complete understanding of the present invention, and the advantages thereof, reference is now made to the following descriptions taken in conjunction with the accompanying drawings, in which:

FIG. 3A is an electrical schematic illustrating one conversion element of the current-based DAC array shown in FIG. 2, along with further details of the associated level shift generator, also shown in FIG. 2.

DETAILED DESCRIPTION OF THE INVENTION

Figure 1:
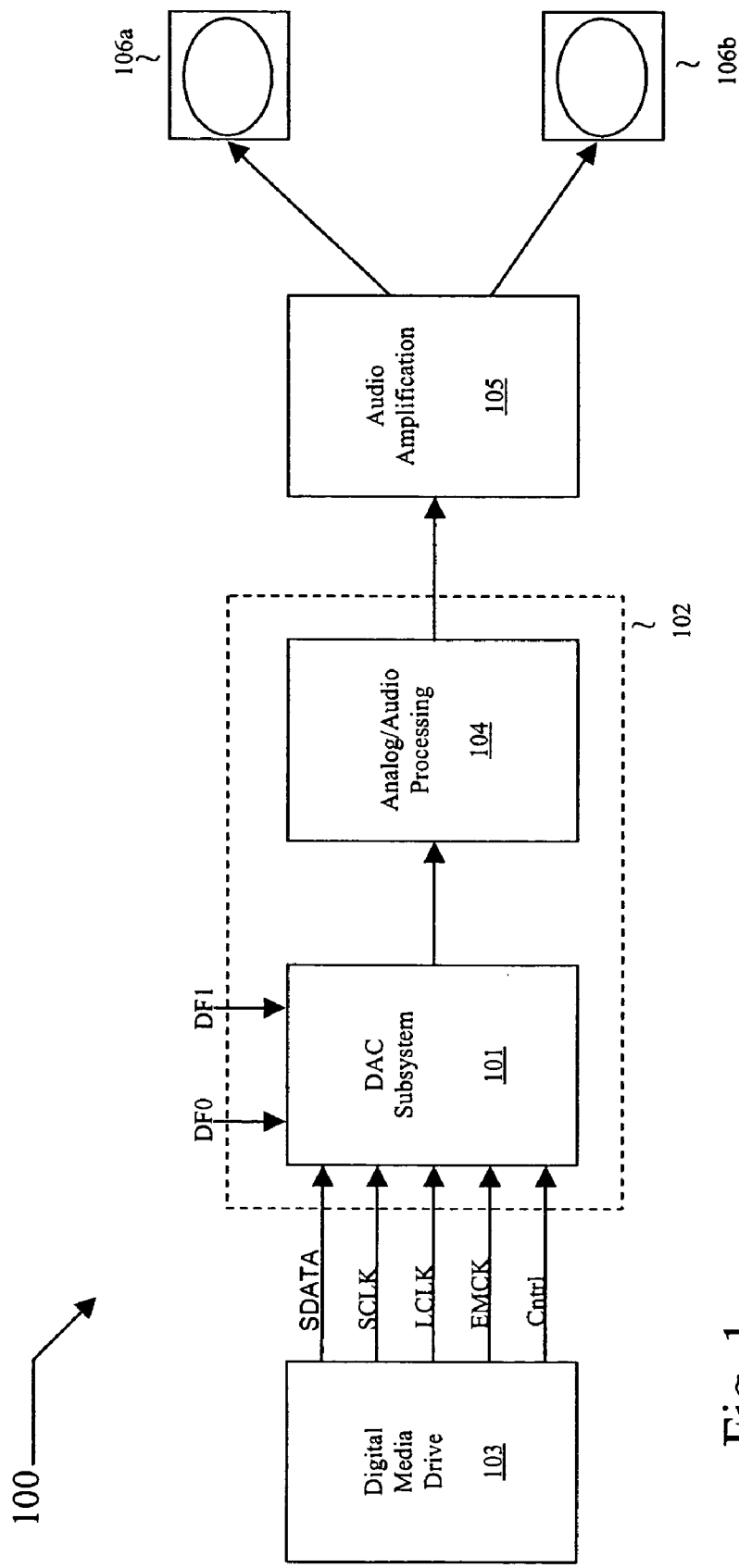
FIG. 1 is a diagram of a typical audio system utilizing a digital-to-analog converter subsystem (DAC) according to the principles of the present invention.
Figure 2:
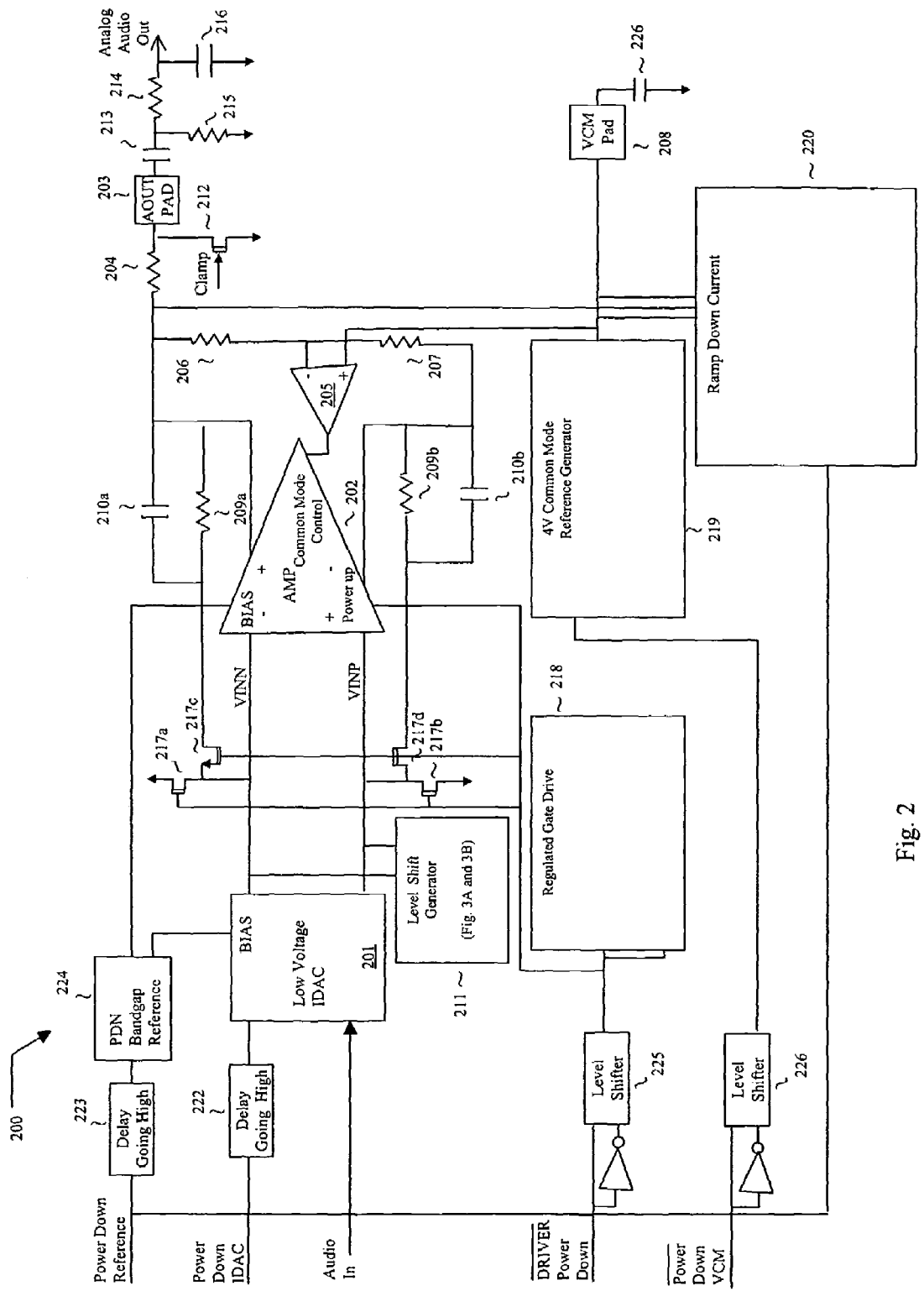
FIG. 2 is an electrical schematic diagram of an exemplary DAC subsystem embodying the principles of the present invention.

The principles of the present invention and their advantages are best understood by referring to the illustrated embodiment depicted in FIGS. 1–3 of the drawings, in which like numbers designate like parts.

FIG. 1 is a diagram of a typical audio system 100 utilizing a digital-to-analog converter subsystem (DAC) 101 according to the principles of the present invention. In this example, DAC subsystem 101 forms part of an audio component 102, such as a compact disk (CD) player, digital audio tape (DAT) player or digital versatile disk (DVD) unit. A digital media drive 103 recovers the digital data and passes those data, along with clocks and control signals, to DAC subsystem 101. The resulting analog (audio) signal undergoes further processing in analog/audio processing circuit block 104 prior to amplification in audio amplifier block 105. Amplifier block 105 then drives a set of conventional speakers 106a and 106b.

Multi-bit digital audio data is received by DAC subsystem 100 serially through the SDATA pin timed by the serial clock (SCLK) signal. The left and right channel data are alternately processed in response to the left-right clock (LRCK) signal, which is normally at the sampling rate. In system 100, the external master clock (EMCK) signal is received by DAC subsystem 101 from digital media drive 103.

FIG. 2 is a block diagram of a digital to analog converter (DAC) 200 embodying the principles of the present invention. In the illustrated embodiment, DAC 200 is an audio DAC, which receives a channel of digital audio data AUDIO IN and outputs an analog audio output signal ANALOG AUDIO OUT. The illustrated embodiment of DAC 200 is suitable for such applications as digital audio system 100 described above in conjunction with FIG. 1. DAC 200 is not limited to utilization in audio systems but may also be utilized in a range of systems applications requiring the conversion of digital data into analog form.

The digital stream AUDIO IN is input into a low voltage current-based (continuous-time) digital to analog converter (IDAC) 201. The differential outputs of IDAC 201, after the voltage level shifting discussed further below, drive corresponding inverting (−) and noninverting (+) low voltage inputs of an operational amplifier stage 202. Operational amplifier 202 also includes differential inverting (−) and non-inverting (+) outputs, with the noninverting (+) output driving analog output (AOUT) pad 203 through resistor 204.

Operational amplifier 202 operates around an input common mode voltage of approximately one (1) volt. The operational amplifier 202 common mode output voltage is approximately 4 volts and is controlled by common mode differential amplifier 205. The voltage at the inverting (−) input to common mode differential amplifier 205 is set by a voltage divider formed by resistors 206 and 207 bridging the noninverting (+) and inverting (−) outputs of operational amplifier 202. The noninverting (+) input to common mode amplifier 205 is tied to the common mode voltage (VCM) reference pad 208.

Differential operational amplifier 202 is associated with two feedback loops, one, which couples the inverting (−) input and the noninverting (+) output of operational amplifier 202, includes a feedback resistor 209a and a feedback capacitor 210a. The second feedback loop, which couples the noninverting (+) input and the inverting (−) output of operational amplifier 202, includes a feedback resistor 209b and a feedback capacitor 210b. A level shift generator 211 ensures that there is an approximately three (3) volt voltage drop across resistors 209a and 209b such that the inputs to operational amplifier 202 remain within a safe operating voltage range, when low voltage differential input transistors are utilized in operational amplifier 202 to save chip area. (Generally, a low voltage n-type metal oxide semiconductor [NMOS] transistor has a channel length approximately eight or nine times shorter than that of a high voltage NMOS transistor. Additionally, low voltage MOS transistors typically help reduce total harmonic distortion, since the gate voltage swing is lower, and have better overall noise performance.)

A clamp transistor 212 at analog output (AOUT) pad 203 clamps the voltage at output pad 203, in response to the control signal CLAMP, to reduce glitches when powering-up opamp 202. The remaining external load presented to analog output (AOUT) pad 203 is represented in FIG. 2 by filtering resistors 214 and 215 and a filtering capacitor 216.

Isolation transistors 217c and 217d under the control of regulated gate drive 218 respectively isolate the inverting (−) and noninverting (+) inputs of operational amplifier 202 from output pad (AOUT) 203 during the power down operations. Specifically, isolation transistors 217c and 217d prevent current flow through external AC coupling cap 213 and thereby prevent the generation of a large voltage spike, and consequently an audible pop, in the signal ANALOG AUDIO OUT. Pulldown transistors 217a and 217b, also under the control of regulated gate drive 218, respectively pull the inverting (−) and noninverting (+) inputs of operational amplifier 202 to a known voltage, in the illustrated embodiment to ground, after isolation transistors 217c and 217d turn-off. In particular, regulated gate drive 218 turns off isolation transistors 217c and 217d as operational amplifier 202 is being powered-down and then turns on pulldown transistors 217a and 217b of FIG. 2.

Common mode reference generator 219 generates a common mode reference voltage at VCM pad 208 and the noninverting (+) input of common mode differential amplifier 205. Common mode reference generator 219 powers down after operational amplifier 202. During power-down, currents through output (AOUT) pad 203 and VCM pad 208 are controlled by ramp down current generator 220 of FIG. 2.

Returning to FIG. 2, power down of IDAC 202 is controlled by the control SIGNAL POWER DOWN IDAC as delayed by Delay 222. The control signal POWER DOWN REFERENCE, as delayed through Delay 223, controls power-down of bandgap reference 224, which provides the bias currents to IDAC 201 and operational amplifier 202. Level shifters 225 and 226 shift the low level control signals DRIVER POWER DOWN\ and POWER DOWN VCM\, generated from a low voltage power supply, to the higher levels required by the circuitry of VCM generator 219 and regulated gate drive 218. To prevent pops in the audio output, the outputs of level shifters 226 and 225 go to a known state, and shut-down operational amplifier 202, if the low voltage supply is removed before the high voltage supply.

FIG. 3A shows one exemplary current DAC element from IDAC array 201 of FIG. 2, along with a more detailed electrical schematic diagram of level shifter 211, also of FIG. 2.

The exemplary current element depicted in FIG. 3A includes a pair of low voltage PMOS transistors 301a and 301b respectively biased by the bias voltages VBP and VBPC. In the illustrated embodiment, low voltage PMOS transistors 301a and 301b are formed in an isolated well of n-type semiconductor (N-well) to minimize substrate noise coupling into IDAC 201 and save chip area. The current through PMOS transistors 301a and 301b from the voltage rail Vdd feed the current paths of NMOS transistors 302a and 302b. The gates of NMOS transistors 302a–302b are respectively driven by corresponding complementary digital data input bits D and DB from the digital audio stream AUDIO IN. The sources of NMOS transistors 302a and 302b are coupled to the outputs of VINN and VINP of IDAC 201 of FIG. 2. The remaining elements of IDAC 201 (not shown) are similarly configured and similarly coupled to the IDAC outputs VINN and VINP, which are in turn connected to the inverting (−) and non-inverting (+) summing nodes of operational amplifier 202 of FIG. 2.

The voltage level shifting operations of voltage level generator 211, discussed above in conjunction with FIG. 2, are implemented by a pair of identical NMOS current source transistors 303a and 303b, biased by the bias voltage VBN. The current through NMOS current source transistors 303a and 303b is set, in the illustrated embodiment, to produce a voltage drop of approximately three (3) volts across operational amplifier feedback resistors 209a and 209b of FIG. 2. Any noise in the bias signal VBN is advantageously attenuated by the internal common mode feedback loop, which includes common mode opamp 205, resistors 206 and 207, and opamp 202.

Current source transistors 303a and 303b operate in conjunction with a pair of NMOS cascode transistors 304a and 304b, biased by the bias voltage VBNC, and a chopper circuit 305. Chopper circuit 305 includes a pair of NMOS transistors 306a and 306b switching in response to the control signal CHOP and a pair of NMOS transistors 307a and 307b operating in response to the complementary control signal CHOPB.

Figure 3B:
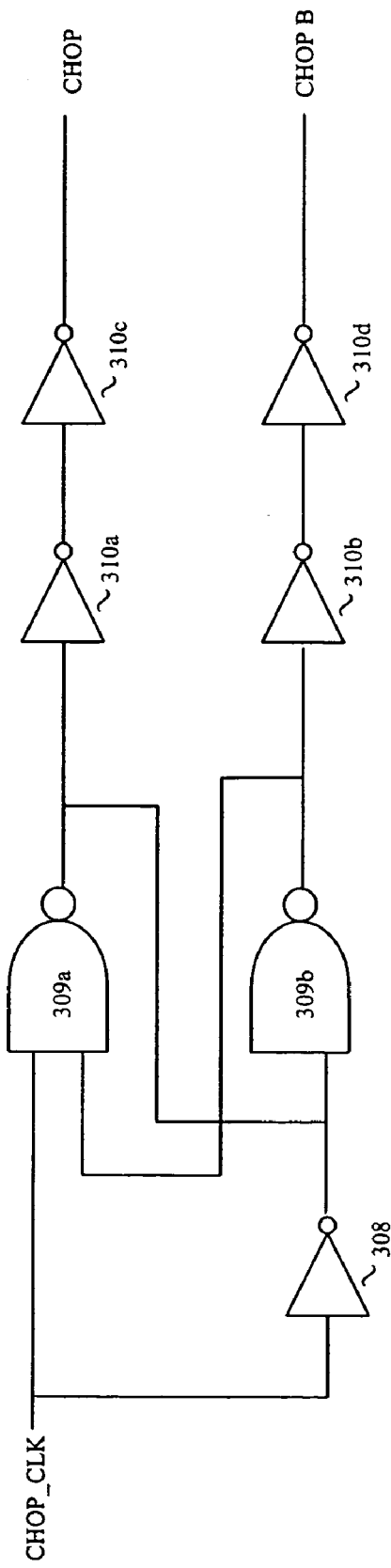
FIG. 3B is an electrical schematic diagram of exemplary control signal generation circuitry suitable for generating the chopping control signals shown in FIG. 3A.

FIG. 3B illustrates one exemplary circuit suitable for generating the non-overlapping control signals CHOP and CHOPB. In the illustrated embodiment of FIG. 3B, the chopping control signal CHOP and CHOPB are generated from a high frequency clock CHOP_CLK which is a multiple of the clock driving the digital data being converted. The circuitry of FIG. 3B includes a input inverter 308, a pair of cross coupled NAND gates 309a and 309b, and a set of inverter/drivers 310a–310d.

Current source transistors 303a and 303b of FIG. 3A generate intrinsic low frequency flicker (1/F) noise which generally has a power spectral density, which is inversely proportional to frequency. According to the principles of the present invention, chopping circuitry 305 chops the NMOS current source transistors 303a and 303b at a high frequency and therefore shifts (modulates) the flicker noise spectrum to much higher out-of-band frequencies. Consequently, the overall noise generated by level shifting circuitry 211 within the signal band of the output signal ANALOG AUDIO OUT of FIG. 2 is reduced.

Returning to FIG. 2, in the illustrated embodiment of digital to analog converter 200, the voltages VINN and VINP at the inverting (−) and noninverting (+) inputs of operational amplifier 202 do not completely settle during data conversion operations. Therefore, according to the principles of the present invention, chopping circuitry 305 of FIG. 3A is disposed between NMOS current source transistors 303a and 303b and NMOS cascode transistors 304a and 304b. The gain of cascode transistors 304a and 304b advantageously reduces the effects of the non-settled voltage at the inverting and non-inverting inputs of operations amplifier 202 during charging and discharging of the parasitic capacitance at the chopping nodes n1 and n2 of FIG. 3A. As a result, the process of chopping the flicker noise generated by NMOS current source transistors 303a and 303b is independent of the non-settled voltage at the VINN and VINP nodes.

While a particular embodiment of the invention has been shown and described, changes and modifications may be made therein without departing from the invention in its broader aspects, and, therefore, the aim in the appended claims is to cover all such changes and modifications as fall within the true spirit and scope of the invention.

What is claimed is:

1. A driver circuit comprising:
   an operational amplifier having an input and an output coupled by a feedback element;
   a voltage level shifter for generating a voltage drop from the operational amplifier output to the operational amplifier input, comprising:
   a current source transistor for setting a current controlling the voltage drop across the feedback element; and
   a chopper circuit for shifting flicker noise generated by the current source transistor to a higher frequency spectrum.

2. The driver circuit of claim 1, further comprising a cascode transistor coupling the chopper circuit and the input of the operational amplifier for attenuating non-settled voltage at the input of the operational amplifier.

3. The driver circuit of claim 1, wherein the chopper circuit couples the input of the operational amplifier and the current source transistor.

4. The driver circuit of claim 1, wherein the operational amplifier comprises a differential operational amplifier having another input and another output coupled by another feedback element, the voltage level shifter generating a voltage drop from the another output to the another input and comprising:
   another current source transistor for setting a current controlling the voltage drop across the another feedback element, flicker noise generated by the another current source transistor shifted to a higher frequency spectrum by the chopper circuit.

5. The driver circuit of claim 4, further comprising another cascode transistor coupling the chopper circuit and the another input of the operational amplifier.

6. A method of voltage level shifting at an input of an operational amplifier comprising:
   generating a voltage drop across a feedback element coupling an input and an output of an operational amplifier circuit by setting a current through a current source transistor; and
   chopping a signal through the current source transistor to shift flicker noise generated by the current source transistor to a higher frequency spectrum with a chopper circuit.

7. The method of claim 6, further comprising attenuating non-settled voltage at the input of the operational amplifier with a cascode transistor coupling the chopper circuit and the input of the operational amplifier.

8. The method of claim 6, wherein chopping the signal through the current source transistor comprises coupling an input of the chopping circuitry to the feedback element and an output of the chopping circuitry to the current source transistor.

9. The method of claim 6, wherein the operational amplifier comprises a differential amplifier and generating a voltage drop across a feedback element comprises generating a voltage drop across a selected one of a feedback element coupling an inverting input and a non-inverting output of the operational amplifier and another feedback element coupling a non-inverting input and an inverting output of the differential amplifier.

10. The method of claim 6, further comprising:
    generating a voltage drop across a second feedback element coupling a second input and a second output of the operational amplifier circuit by setting a current through a second current source transistor; and
    chopping a signal through the second current source transistor to shift flicker noise generated by the second current source transistor to a higher frequency spectrum with a chopper circuit.

11. A digital to analog converter comprising:
    a data conversion element including a current element and switches for selectively switching current through the current element to first and second signal lines in response to a data bit and a complementary data bit;
    an operational amplifier, first and second summing nodes at the operational amplifier inputs coupled to the first and second signal lines and to first and second outputs of the operational amplifier through first and second feedback elements; and
    a level shifter for controlling a voltage on the first and second signal lines, comprising:
    first and second current source transistors for respectively pulling current from the first and second signal lines; and
    chopper circuitry coupled to the first and second current source transistors for shifting flicker noise to a higher frequency spectrum.

12. The digital to analog converter of claim 11, wherein the operational amplifier has an output common mode voltage higher than the input common mode voltage and the first and second current source transistors produce a voltage drop across the first and second feedback elements for protecting the first and second inputs of the operational amplifier.

13. The digital to analog converter of claim 12, wherein the operational amplifier includes low voltage input transistors at the first and second inputs.

14. The digital to analog converter of claim 12, wherein the current element of the data conversion element comprises at least one low voltage transistor.

15. The digital to analog converter of claim 14, wherein the at least one low voltage transistor comprises a p-type metal oxide semiconductor transistor.

16. The digital to analog converter of claim 11, wherein the first and second current source transistors comprise n-type metal oxide semiconductor transistors.

17. The digital to analog converter of claim 11, further comprising an input for receiving a stream of digital audio data.

18. The digital to analog converter of claim 11, further comprising first and second cascode transistors for coupling the chopping circuitry with the first and second signal lines for attenuating non-settled voltage at the input of the operational amplifier.

19. The digital to analog converter of claim 11, further comprising circuitry for generating at least one chopping control signal from a high frequency clock signal.

20. The digital to analog converter of claim 11, wherein the digital to analog converter forms a portion of a digital audio processing system.

* * * * *